United States Patent
Huang et al.

(10) Patent No.: US 11,939,668 B2
(45) Date of Patent: Mar. 26, 2024

(54) GAS DELIVERY FOR TUNGSTEN-CONTAINING LAYER

(71) Applicant: Applied Materials, Inc., Santa Clara, CA (US)

(72) Inventors: Zubin Huang, Santa Clara, CA (US); Mohammed Jaheer Sherfudeen, Guduvancheri (IN); David Matthew Santi, San Mateo, CA (US); Jallepally Ravi, San Ramon, CA (US); Peiqi Wang, Campbell, CA (US); Kai Wu, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/729,943

(22) Filed: Apr. 26, 2022

(65) Prior Publication Data

US 2023/0340662 A1 Oct. 26, 2023

(51) Int. Cl.
  *C23C 16/06* (2006.01)
  *C23C 16/08* (2006.01)
  (Continued)

(52) U.S. Cl.
  CPC ........ *C23C 16/08* (2013.01); *C23C 16/45523* (2013.01); *C23C 16/458* (2013.01)

(58) Field of Classification Search
  CPC .......... C23C 16/06; C23C 16/08; C23C 16/14
  See application file for complete search history.

(56) References Cited

U.S. PATENT DOCUMENTS 5,028,565 A * 7/1991 Chang ............... H01L 21/32051
  438/654
6,939,804 B2   9/2005 Lai et al.
  (Continued)

FOREIGN PATENT DOCUMENTS

CN   107475687 A   12/2017

OTHER PUBLICATIONS

Yang, Mengdi, et al., "Low-resistivity a-phase tungsten films grown by hot-wire assisted atomic layer deposition in high-aspect-ratio structures". Thin Solid Films 646 (2018) 199-208.*
(Continued)

*Primary Examiner* — Bret P Chen
(74) *Attorney, Agent, or Firm* — Patterson + Sheridan LLP

(57) ABSTRACT

A method of forming a tungsten-containing layer over a substrate includes a) positioning a substrate on a substrate support in a process volume of a process chamber; b) providing a precursor gas to the process volume of the process chamber for a first duration; and c) providing a tungsten-containing gas to the process volume of the process chamber by opening a pulsing valve on a tungsten-containing gas delivery line for a second duration occurring after the first duration to form a tungsten-containing layer on the substrate. The tungsten-containing gas delivery line includes a first section connected to an inlet of the pulsing valve and a second section connected to an outlet of the pulsing valve, the first section connects the inlet of the pulsing valve to a reservoir of tungsten-containing gas, the second section connects the outlet of the pulsing valve to an inlet of the process chamber.

20 Claims, 2 Drawing Sheets

(51) Int. Cl.
*C23C 16/455* (2006.01)
*C23C 16/458* (2006.01)

(56) References Cited

U.S. PATENT DOCUMENTS

| | | | | |
|---|---|---|---|---|
| 7,141,494 | B2* | 11/2006 | Lee | H01L 21/28562 |
| | | | | 438/677 |
| 7,211,144 | B2* | 5/2007 | Lu | C30B 29/02 |
| | | | | 257/E21.171 |
| 7,396,565 | B2 | 7/2008 | Yang et al. | |
| 7,695,563 | B2* | 4/2010 | Lu | C23C 16/45523 |
| | | | | 117/89 |
| 7,745,333 | B2 | 6/2010 | Lai et al. | |
| 7,964,505 | B2* | 6/2011 | Khandelwal | H01L 21/76855 |
| | | | | 257/E21.585 |
| 9,574,268 | B1* | 2/2017 | Dunn | C23C 16/45512 |
| 2001/0016364 | A1* | 8/2001 | Loan | C23C 16/4404 |
| | | | | 422/112 |
| 2003/0101938 | A1* | 6/2003 | Ronsse | C23C 16/4401 |
| | | | | 118/712 |
| 2003/0203616 | A1* | 10/2003 | Chung | H01L 21/76873 |
| | | | | 438/653 |
| 2004/0202786 | A1* | 10/2004 | Wongsenakhum | |
| | | | | C23C 16/0281 |
| | | | | 427/250 |
| 2005/0221000 | A1* | 10/2005 | Ikeda | C23C 16/02 |
| | | | | 427/532 |
| 2007/0093078 | A1* | 4/2007 | Harada | H01L 21/02362 |
| | | | | 257/E21.273 |
| 2007/0119371 | A1* | 5/2007 | Ma | H01J 37/32449 |
| | | | | 118/715 |
| 2009/0053893 | A1* | 2/2009 | Khandelwal | H01L 21/28562 |
| | | | | 257/E21.17 |
| 2009/0087550 | A1* | 4/2009 | Leusink | C23C 16/45525 |
| | | | | 427/126.1 |
| 2015/0279736 | A1* | 10/2015 | Hotta | H01L 21/76883 |
| | | | | 438/660 |
| 2017/0121818 | A1* | 5/2017 | Dunn | C23C 16/4557 |
| 2020/0041407 | A1 | 2/2020 | Huang et al. | |
| 2020/0181774 | A1 | 6/2020 | Pudas | |

OTHER PUBLICATIONS

Klaus, J.W., et al., "Atomic layer deposition of tungsten using sequential surface chemistry with a sacrificial stripping reaction". Thin Solid Films 360 (2000) 145-153.*

Lemaire, Paul C., et al., "Understanding inherent substrate selectivity during atomic layer deposition: Effect of surface preparation, hydroxyl density, and metal oxide composition on nucleation mechanisms during tungsten ALD". J. Chem. Phys. 146, 052811 (2017) pp. 1-9.*

Ganguli, Seshadri, et al., "Development of tungsten nitride film as barrier layer for copper metallization". J. Vac. Sci. Technol. B 18 (1), Jan./Feb. 2000, pp. 237-241.*

Kolawole, Funsho Olaitan, et al., "Deposition and characterization of tungsten oxide (WO3) nanoparticles incorporated diamond-like carbon coatings using pulsed-DC PECVD". Materials Letters 282 (2021) 128645, pp. 1-4.*

Vahlas, Constantin and Caussat, Brigitte and Gladfelter, Wayne L. and Senocq, François and Gladfelter, Elisabeth Liquid and Solid Precursor Delivery Systems in Gas Phase Processes. (2015) Recent Patents on Materials Science, vol. 8 (n° 2). pp. 91-108.*

International Search Report dated Jul. 18, 2023 for Application No. PCT/US2023/018001.

* cited by examiner

GAS DELIVERY FOR TUNGSTEN-CONTAINING LAYER

BACKGROUND

Field

Embodiments of the present disclosure generally relate to forming a tungsten-containing layer. More specifically, embodiments described herein relate to a gas delivery system and methods for forming a tungsten-containing layer.

Description of the Related Art

Metal-containing layers, such as tungsten-containing layers, are used in a variety of structures in devices, such as semiconductor devices. One type of structure often formed over substrates is a high aspect ratio structure. As the aspect ratio of structures increase, it can be challenging to adequately fill the high aspect ratio structures with a given material, such as a metal-containing layer (e.g., a tungsten-containing layer).

To assist in filling a high aspect ratio structure with tungsten, a tungsten-containing gas (e.g., tungsten hexafluoride) can be pulsed into a process chamber along with a gas (e.g., diborane) to react with the tungsten-containing gas. The pulse can assist in allowing the tungsten from the tungsten-containing gas to reach the deeper portions of the high aspect ratio structures.

Although the pulsing can assist in allowing the tungsten to reach the deeper portions of the high aspect ratio structures, problems remain. For example, the tungsten layers formed from these pulsing processes often have a haze and/or may not be formed to a targeted level of purity or composition ratio. In one such example, a tungsten layer formed from a pulsing process can include a percentage of boron that is too high.

Accordingly, what is needed is a system and related process for forming a tungsten layer without the problems mentioned above.

SUMMARY

In one embodiment, a method of forming a tungsten-containing layer over a substrate is provided. The method includes a) positioning a substrate on a substrate support in a process volume of a process chamber; b) providing a precursor gas to the process volume of the process chamber for a first duration; and c) providing a tungsten-containing gas to the process volume of the process chamber by opening a pulsing valve on a tungsten-containing gas delivery line for a second duration occurring after the first duration to form a tungsten-containing layer on the substrate, wherein the tungsten-containing gas delivery line includes a first section connected to an inlet of the pulsing valve and a second section connected to an outlet of the pulsing valve, the first section connects the inlet of the pulsing valve to a reservoir of tungsten-containing gas, the second section connects the outlet of the pulsing valve to an inlet to a process chamber, and an internal cross-sectional area of the first section of the tungsten-containing gas delivery line is at least 10% larger than an internal cross-sectional area of the second section of the tungsten-containing gas delivery line.

In another embodiment, a method of forming a tungsten-containing layer is provided. The method includes a) positioning a substrate on a substrate support in a process volume of a process chamber; b) providing a precursor gas to the process volume of the process chamber for a first duration; and c) providing a tungsten-containing gas to the process volume of the process chamber by opening a pulsing valve on a tungsten-containing gas delivery line for a second duration occurring after the first duration to form a tungsten-containing layer on the substrate, wherein the tungsten-containing gas delivery line includes a first section connected to an inlet of the pulsing valve and a second section connected to an outlet of the pulsing valve, the first section connects the inlet of the pulsing valve to a reservoir of tungsten-containing gas, and the second section connects the outlet of the pulsing valve to an inlet to a process chamber; and providing a carrier gas to the second section of the tungsten-containing gas delivery line.

In another embodiment, a method of forming a tungsten-containing layer is provided. The method includes a) positioning a substrate on a substrate support in a process volume of a process chamber; b) providing a boron-containing gas to the process volume of the process chamber for a first duration; and c) providing a tungsten-containing gas to the process volume of the process chamber by opening a pulsing valve on a tungsten-containing gas delivery line for a second duration occurring after the first duration to form a tungsten-containing layer on the substrate, the tungsten-containing layer filling a plurality of high aspect ratio structures disposed over the substrate, wherein the tungsten-containing gas delivery line includes a first section connected to an inlet of the pulsing valve and a second section connected to an outlet of the pulsing valve, the first section connects the inlet of the pulsing valve to a reservoir of tungsten-containing gas, the second section connects the outlet of the pulsing valve to an inlet to a process chamber, and an internal cross-sectional area of the first section of the tungsten-containing gas delivery line is at least 10% larger than an internal cross-sectional area of the second section of the tungsten-containing gas delivery line.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to forming a tungsten-containing layer. More specifically, embodiments described herein relate to a gas delivery system and methods for forming a tungsten-containing layer.

Figure 1:
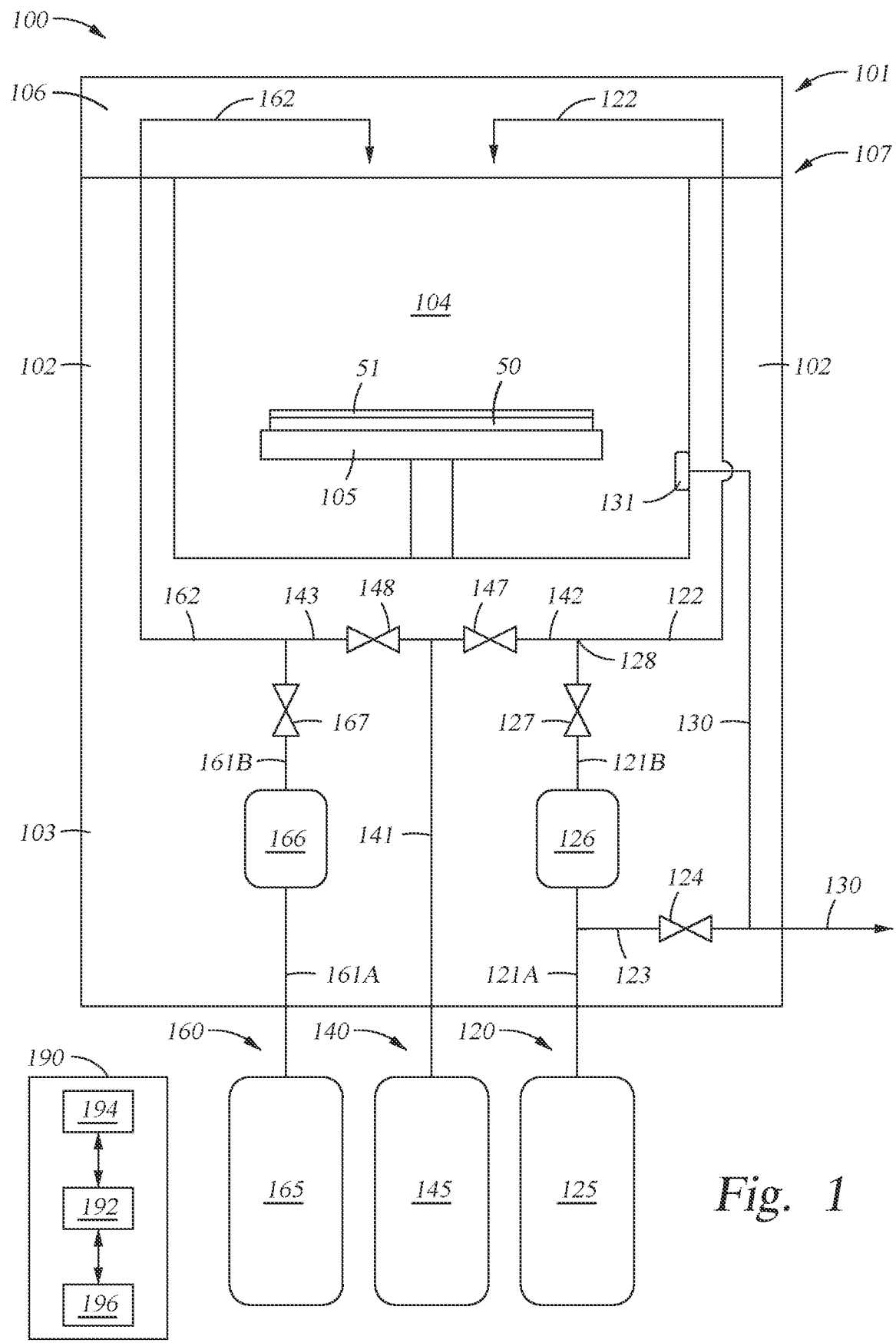
FIG. 1 is a schematic view of a processing system, according to one embodiment.

FIG. 1 is a schematic view of a processing system 100, according to one embodiment. The processing system 100 can be used to deposit a metal-containing layer, such as a tungsten-containing layer over a substrate. Although the following disclosure mainly describes using a pulsed chemical vapor deposition (CVD) process to form a nucleation layer of tungsten-containing material over high aspect ratio structures formed on a substrate, the benefits of the disclosure are generally applicable to any process (e.g., atomic layer deposition, bulk CVD, plasma enhanced CVD, etc.) in which a tungsten-containing gas (e.g., tungsten hexafluoride $WF_6$) is supplied to a process chamber.

The processing system 100 includes a process chamber 101, a first gas delivery line 120 (also referred to a tungsten-containing gas delivery line), a second gas delivery line 160, and a carrier gas delivery line 140. The gas delivery lines 120, 140, 160 can provide gases to the interior of the process chamber 101, so that a deposition process on a substrate positioned inside the process chamber 101 can be performed. The processing system 100 further includes an exhaust line 130 connected to an exhaust inlet 131 of the process chamber 101. The exhaust line 130 can be used to evacuate gases from the process volume 104. The exhaust line 130 can be connected to a vacuum pump (not shown).

The process chamber 101 includes a chamber body 107 enclosing a process volume 104. The chamber body 107 includes a top 106, a bottom 103 and one or more sidewalls 102 connecting the top 106 to the bottom 103. Simplified versions of the top 106 and bottom 103 are shown for ease of illustration and each may include additional equipment (not shown). For example, the top 106 may include additional equipment, such as a showerhead or other equipment for evenly distributing the gases to the process volume 104.

The process chamber 101 further includes a substrate support 105 positioned in the process volume 104. A substrate 50 can be positioned on the substrate support 105 in the process volume 104, so that a tungsten-containing layer 51 can be formed (e.g., deposited) over the substrate 50. Examples of tungsten-containing layers that can be formed using the processes described herein include tungsten doped with boron, for example where the boron has a concentration from about 1% to about 20%, such as about 10% of the tungsten-containing layer. Although not shown, the substrate 50 can include a plurality of high aspect ratio structures formed on the substrate before the deposition is performed. In one non-limiting example, these high aspect ratio structures can be formed of titanium nitride. The deposition processes described below can be useful for forming a tungsten-containing layer to fill these high aspect ratio structures, such as filling trenches having an aspect ratio of 10:1, 20:1 or higher aspect ratios.

The first gas delivery line 120 can be used to provide a tungsten-containing gas, such as tungsten hexafluoride ($WF_6$), to the process volume 104 of the process chamber 101 during the deposition of the tungsten-containing layer 51. In some embodiments, other tungsten-containing gases may be used instead of tungsten hexafluoride to form the tungsten-containing layer 51.

The second gas delivery line 160 can be used to provide a precursor gas, such as a boron-containing gas, such as diborane ($B_2H_6$), to the process volume 104 of the process chamber 101. In some embodiments, other boron-containing gases, such as borane ($BH_3$) may be used instead of diborane. Furthermore, in some embodiments, a precursor that includes elements other than boron may also be used. For example, in some embodiments, silane ($SiH_4$) or disilane ($Si_2H_6$) may be used as the precursor to react with the tungsten-containing gas instead of a boron-containing gas, such as diborane.

The carrier gas delivery line 140 can be used to provide a carrier gas, such as argon, to first gas delivery line 120 and to the second gas delivery line 160 to assist in delivering the tungsten-containing gas and the precursor gas to the process volume 104 of the process chamber 101 through the delivery lines 120, 160. In some embodiments, other carrier gases, such as hydrogen, helium, or nitrogen, may also be used instead of or in addition to argon. For example, in one embodiment, hydrogen is used as a carrier gas for $B_2H_6$ while argon is used as the carrier gas for $WF_6$. The carrier gas provided by the carrier gas delivery line 140 may also be used to purge equipment upstream of the process volume, for example if the tungsten-containing gas and the precursor gas each enter the process through any shared equipment, such as a showerhead used by both the tungsten-containing gas and the precursor gas. Even if no equipment is shared, the carrier gas can be used between pulses of the precursor gas and the tungsten-containing gas to increase proportion of the reactions between the precursor gas and the tungsten-containing gas occurring near the substrate 50 as opposed to occurring, for example portions of the process volume 104 near the top 106 of the process chamber 101.

The first gas delivery line 120 can include a tungsten-containing gas source 125 (e.g., a pressurized tank of $WF_6$), a tungsten-containing gas reservoir 126, a pulsing valve 127, and sections of fluid conduit (e.g., sections of piping, tubing, fittings, etc. that can be used to transport fluid, such as gases or liquids) described below. These sections of fluid conduit are described in relation to the pulsing valve 127.

The first gas delivery line 120 can include an inlet section 121 connecting the tungsten-containing gas source 125 to the pulsing valve 127. The inlet section 121 includes a reservoir supply section 121A and a reservoir discharge section 121B (also referred to as a first section). The reservoir supply section 121A connects the tungsten-containing gas reservoir 126 with the tungsten-containing gas source 125. The reservoir discharge section 121B connects the tungsten-containing gas reservoir 126 with the inlet side of the pulsing valve 127. The tungsten-containing gas reservoir 126 can store a volume of the tungsten-containing gas close to the pulsing valve 127, so that there is a sufficient volume and pressure of the tungsten-containing gas to be provided through the pulsing valve 127 when the pulsing valve 127 opens.

The first gas delivery line 120 can further include an outlet section 122 (also referred to as the second section) connecting the outlet side of the pulsing valve 127 with the process volume 104 of the process chamber 101.

The pulsing valve 127 can be configured to open for a designated pulse duration to deliver a predetermined amount of the tungsten-containing gas from the inlet section 121 to the outlet section 122 and process volume 104 of the process chamber 101. In some embodiments, the pulsing valve 127 is configured to open for a pulse duration from about 0.1 seconds to about 10.0 seconds, such as from about 1.0 second to about 3.0 seconds, such as about 2.0 seconds.

The first gas delivery line 120 can further include a divert section 123 that can be used to provide a flow of the tungsten-containing gas to the exhaust line 130 (also referred to as the foreline). The divert section 123 can include a divert valve 124 to control the flow of the tungsten-containing gas to the exhaust line 130. The supply for the divert section 123 is connected to the reservoir supply section 121A upstream of the tungsten-containing gas reservoir 126. In some other embodiments, the divert section 123 is connected to the reservoir discharge section 121B between the tungsten-containing gas reservoir 126 and the pulsing valve 127. Providing a flow of the tungsten-containing gas to the exhaust line 130 can help reduce the concentration of other gases inside the first gas delivery line 120 and process volume 104 that accumulate between production runs. The divert valve 124 is generally opened at the beginning of a process to assist in removing these other gases, and the divert valve 124 generally closes once the tungsten-containing gas reservoir 126 is filled to a sufficient pressure. Although not shown, the first gas delivery line 120 and the other gas delivery lines 140, 160 can include a plurality of other sensors, valves, and flow controllers (e.g., mass flow controllers) not shown to assist in delivering the gas from the respective gas sources 125, 145, 165.

The second gas delivery line 160 can include a precursor gas source 165, such as a boron-containing gas source (e.g., a pressurized tank of $B_2H_6$), a precursor gas reservoir 166, a pulsing valve 167, and sections of fluid conduit (e.g., sections of piping, tubing, fittings, etc. that can be used to transport fluid) described below. These sections are described in relation to the pulsing valve 167.

The second gas delivery line 160 can include an inlet section 161 connecting the precursor gas source 165 to the pulsing valve 167. The inlet section 161 includes a reservoir supply section 161A and a reservoir discharge section 161B. The reservoir supply section 161A connects the precursor gas reservoir 166 with the precursor gas source 165. The reservoir discharge section 161B connects the precursor gas reservoir 166 with the inlet side of the pulsing valve 167. The precursor gas reservoir 166 can store a volume of the precursor gas close to the pulsing valve 167, so that there is a sufficient volume and pressure of the precursor gas to be provided through the pulsing valve 167 when the pulsing valve 167 opens.

The second gas delivery line 160 can further include an outlet section 162 connecting the outlet side of the pulsing valve 167 with the process volume 104 of the process chamber 101.

The pulsing valve 167 can be configured to open for a designated pulse duration to deliver a predetermined amount of the tungsten-containing gas from the inlet section 161 to the outlet section 162 and process volume 104 of the process chamber 101. In some embodiments, the pulsing valve 167 is configured to open for a pulse duration from about 0.1 seconds to about 10.0 seconds, such as from about 1.0 second to about 3.0 seconds, such as about 2.0 seconds. Although not shown, the second gas delivery line 160 can also include a divert section with a divert valve similar to the divert section 123 described above to lower the concentration of gases other than the precursor gas. This divert section can be used at the beginning of a process to assist in removing these other gases that have accumulated between production runs.

The carrier gas delivery line 140 can include a carrier gas source 145 (e.g., a pressurized tank of argon), a first valve 147, a second valve 148, and the sections of fluid conduit (e.g., sections of piping, tubing, fittings, etc. that can be used to transport fluid) described below. These sections are described in relation to the valves 147, 148.

The carrier gas delivery line 140 can include an inlet section 141 connecting the carrier gas source 145 with the valves 147, 148. The carrier gas delivery line 140 can further include a first outlet section 142 connecting the outlet side of the first valve 147 with the outlet section 122 of the first gas delivery line 120 at a location 128 on the outlet section 122. The location 128 can be relatively close to the pulsing valve 127 as described in more detail below. The first outlet section 142 is configured to provide the carrier gas to the outlet section 122, so that the carrier gas can assist in providing the tungsten-containing gas to the process volume 104 of the process chamber 101.

The carrier gas delivery line 140 can further include a second outlet section 143 connecting the outlet side of the second valve 148 with the outlet section 162 of the second gas delivery line 160. The second outlet section 143 is configured to provide the carrier gas to the outlet section 162, so that the carrier gas can assist in providing the precursor gas to the process volume 104 of the process chamber 101.

Although a single carrier gas source 145 is shown, in some embodiments, separate carrier gas sources are used, so that the carrier gas lines are completely independent. Having independent carrier gas sources and lines can allow for different carrier gases (e.g., hydrogen and argon) to be used for the precursor gas and the tungsten-containing gas and can also help prevent any mixing of the precursor gas and the tungsten-containing gas outside of the process volume 104 of the process chamber 101.

The processing system 100 includes features that improve the deposition of the tungsten-containing layer 51 compared to conventional processing systems. For example, the processing system 100 can be used to deposit tungsten-containing layers having the targeted proportions of materials (e.g., 90% tungsten and 10% boron) more consistently than conventional processing systems.

A first feature that provides improvement is that the internal diameter (or cross-sectional area) of the reservoir discharge section 121B is at least 10% larger than the internal diameter (or cross-sectional area) of the outlet section 122. In some embodiments, the internal diameter (or cross-sectional area) of the reservoir discharge section 121B is at least 30% larger, at least 50% larger, or at least 100% larger than the internal diameter (or cross-sectional area) of the outlet section 122. In one specific embodiment, the internal diameter of the reservoir discharge section 121B is ⅜ of an inch while the internal diameter of the outlet section 122 is ¼ of an inch.

During processing, the portion of the outlet section 122 downstream of location 128 includes a flow of the tungsten-containing gas from the reservoir discharge section 121B and a flow of the carrier gas from the carrier gas delivery line 140 simultaneously while the reservoir discharge section 121B only includes the flow of the tungsten-containing gas flowing through the reservoir discharge section 121B. Thus, the outlet section 122 includes all of the flowrate of gas from the reservoir discharge section 121B plus the flowrate of gas from the carrier gas delivery line 140. Thus, the total flowrate outlet section 122 is substantially higher than the total flowrate of gas in the reservoir discharge section 121B.

Generally, the internal diameter of a fluid conduit is designed to increase or at least remain the same when the flowrate of fluid through the conduit increases. Thus, it is counter-intuitive to design the fluid conduit with the lower flowrate (i.e., the reservoir discharge section 121B) to have the larger internal diameter compared to the fluid conduit with the higher flowrate (i.e., the outlet section 122). Without being bound by any theory, it is thought that the larger diameter in the reservoir discharge section 121B when compared to the outlet section 122 may result in less abrupt pressure changes in the reservoir discharge section 121B compared to when the reservoir discharge section 121B is designed to have the same or a smaller internal diameter relative to internal diameter of the outlet section 122. Abrupt pressure changes can result in potential condensing of the tungsten-containing gas and non-uniform gas flowrates. Because there are less abrupt pressure changes in the reservoir discharge section 121B, a more consistent flowrate of the tungsten-containing gas can be provided to the outlet section 122 and ultimately to the process volume 104 of the process chamber 101, which improves the consistency of the depositions being performed.

A second feature that provides improvement of the processing system 100 relative to conventional processing systems is that the carrier gas is provided to the first gas delivery line 120 downstream of the pulsing valve 127 of the first gas delivery line 120. In some embodiments, the carrier gas is provided to the first gas delivery line 120 at the location 128 on the outlet section 122 that is downstream and relatively close to the pulsing valve 127. For example, the location 128 can be from about 0.5 inches to about 6.0 inches downstream from the pulsing valve 127, such as from about 1.0 inch to about 3.0 inches, such as about 2.0 inches downstream from the pulsing valve 127. Providing the carrier gas downstream of the pulsing valve 127 can also reduce the abrupt pressure changes in the reservoir discharge section 121B compared to when the carrier gas is provided upstream of the pulsing valve 127. Other features that can also reduce these pressure changes can include not placing the divert valve along the flow path that is used during production as well as the selection of the type of pulsing valve being used. For example, a vacuum coupling radiation (VCR) valve can cause less abrupt pressure changes than a standard surface mount valve.

The processing system 100 can further include a controller 190 connected to the equipment shown in FIG. 1. The controller 190 can be any type of controller used in an industrial setting, such as a programmable logic controller (PLC). The controller 190 includes a processor 192, a memory 194, and input/output (I/O) circuits 196. The controller 190 can further include one or more of the following components (not shown), such as one or more power supplies, clocks, communication components (e.g., network interface card), and user interfaces typically found in controllers for semiconductor equipment.

The memory 194 can include non-transitory memory. The non-transitory memory can be used to store the programs and settings described below. The memory 194 can include one or more readily available types of memory, such as read only memory (ROM) (e.g., electrically erasable programmable read-only memory (EEPROM), flash memory, floppy disk, hard disk, or random access memory (RAM) (e.g., non-volatile random access memory (NVRAM).

The processor 192 is configured to execute various programs stored in the memory 194, such as a program configured to execute the method 1000 described below in reference to FIG. 2. During execution of these programs, the controller 190 can communicate to I/O devices (e.g., sensors and actuators) through the I/O circuits 196. For example, during execution of these programs and communication through the I/O circuits, the controller 190 can control outputs (e.g., open and close valves) and receive information from feedback devices (e.g., feedback on the open/close state of valves), sensors, and other instrumentation in the processing system 100. The memory 194 can further include various operational settings used to control the processing system 100. For example, the settings can include settings for controlling (1) the duration of blocks 1004, 1006, 1008, 1010, and 1014 in the method 1000 described below in reference to FIG. 2, (2) the temperature and pressure inside the process chamber 101 during the deposition of the tungsten-containing layer 51 as described herein, and (3) the flowrates of the gases provided to the process volume 104 during different portions of the method 1000 described below in reference to FIG. 2 among various other settings.

Figure 2:
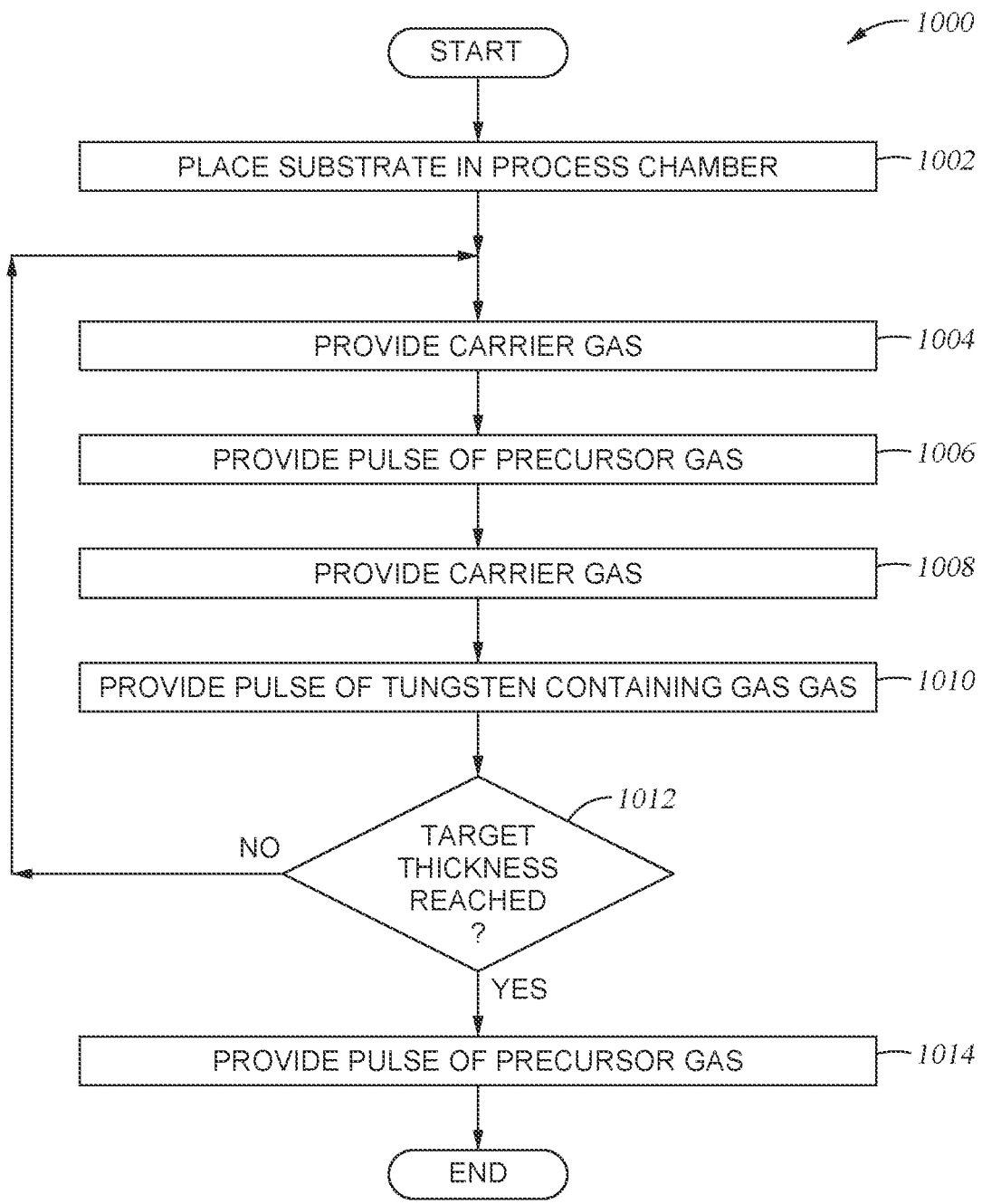
FIG. 2 is a process flow diagram of a method of forming the tungsten-containing layer shown in FIG. 1, according to one embodiment.

FIG. 2 is a process flow diagram of a method 1000 of forming the tungsten-containing layer 51 shown in FIG. 1, according to one embodiment. The method 1000 begins at block 1002.

At block 1002, the substrate 50 is positioned on the substrate support 105 in the process volume 104 of the process chamber 101. The divert process for the first gas delivery line 120 described above may begin at this time as well. The divert process described above is assumed to be finished before proceeding to block 1004.

At block 1004, the valves 147, 148 are opened, and the carrier gas (e.g., argon) is provided to the process volume 104 through the sections 122, 162. During block 1004, the carrier gas can be provided at flowrates from about 1 to about 10 liters per minute, such as from about 2 to about 5 liters per minute. In some embodiments, the flowrate of the carrier gas can remain relatively constant throughout the method 1000.

At block 1006, a pulse of the precursor gas, such as a boron-containing gas (e.g., diborane) can be provided to the process volume 104 of the process chamber 101 by opening the pulsing valve 167 for a designated pulse duration (also referred to as first duration). In some embodiments, the pulsing valve 167 is configured to open for a pulse duration from about 0.1 seconds to about 10.0 seconds, such as from about 1.0 second to about 3.0 seconds, such as about 2.0 seconds. After the designated pulse duration, the pulsing valve 167 closes. During block 1006, the precursor gas can be provided at a flowrate from about 100 sccm to about 1000 sccm, such as from about 200 sccm to about 600 sccm (e.g., 350 sccm). Starting with a pulse of the precursor gas can assist with helping the nucleation process start for forming the tungsten-containing layer over another layer on the substrate, for example over a plurality of high aspect structures formed of titanium nitride.

At block 1008, the carrier gas continues to be provided to the process volume 104. Block 1008 can continue for a predetermined duration, such as from about from about 0.1 seconds to about 10.0 seconds, such as from about 1.0 second to about 3.0 seconds, such as about 2.0 seconds. The duration of block 1008 can be adjusted to increase the proportion of the reaction between the tungsten-containing gas (provided at block 1010) and the precursor gas (provided at block 1006) that occurs near the substrate 50 as opposed to other locations in the process volume 104, such as a location in the process volume 104 near the top 106 of the process chamber 101.

At block 1010, a pulse of the tungsten-containing gas (e.g., $WF_6$) can be provided to the process volume 104 of the process chamber 101 by opening the pulsing valve 127 for a designated pulse duration (also referred to as second duration). In some embodiments, the pulsing valve 167 is configured to open for a pulse duration from about 0.1 seconds to about 10.0 seconds, such as from about 1.0 second to about 3.0 seconds, such as about 2.0 seconds. After the designated pulse duration, the pulsing valve 167 closes. During block 1010, the tungsten-containing gas can be provided at a flowrate from about 20 sccm to about 400 sccm, such as from about 50 sccm to about 150 sccm.

Providing the tungsten-containing gas at block 1010 enables a reaction between the precursor gas (e.g., $B_2H_6$) and the tungsten-containing gas (e.g., $WF_6$) to occur, so that the tungsten-containing layer 51 can be deposited over the substrate 50, for example over high aspect ratio structures (e.g., trenches) formed over the substrate 50.

At block 1010, the tungsten-containing gas is provided through the reservoir discharge section 121B that has an internal cross-sectional area that is at least 10%, such as at least 30% larger, at least 50% larger, or at least 100% larger than the internal cross-sectional area of the outlet section 122. As described above, this increased cross-sectional area of the reservoir discharge section 121B can reduce abrupt pressure changes of the tungsten-containing gas that can cause non-uniform flowrates and possible condensing of the tungsten-containing gas. Additionally, in some embodiments, the carrier gas is provided to the first gas delivery line 120 at the location 128 on the outlet section 122 that is downstream and relatively close to the pulsing valve 127. Providing the carrier gas downstream of the pulsing valve 127 can also reduce abrupt pressure changes in the reservoir discharge section 121B compared to when the carrier gas is provided upstream of the pulsing valve 127. Reducing these abrupt pressure changes can lead to more uniform and consistent deposition of the tungsten-containing layer 51.

At block 1012, a determination can be made to determine whether a target thickness of the tungsten-containing layer 51 being deposited has been reached. In some embodiments, the target thickness can be from about 25 Angstroms to about 200 Angstroms, such as about 100 Angstroms. In one embodiment, this thickness determination can be made based on a total number of times that blocks 1004-1010 have been executed. Generally, blocks 1004-1012 can be repeated five or more times, such as about ten to twenty times.

At block 1012, if the target thickness has not been reached, then block 1004-1010 are repeated. When these blocks are repeated, the repeated block 1004 can have a duration that is similar to the duration of block 1008 described above to increase the percentage of the reaction occurring near the substrate 50 as opposed to other locations in the process volume 104. At block 1012, if the target thickness has been reached, then the method 1000 proceeds to block 1014.

At block 1014, an additional pulse of the precursor gas is provided to the process volume 104. This additional pulse of precursor gas can assist, for example when a bulk CVD process is used to form a thicker tungsten-containing layer over the tungsten-containing layer 51 formed using the method 1000 described herein.

While the foregoing is directed to examples of the present disclosure, other and further examples of the disclosure may be devised without departing from the basic scope thereof, and the scope thereof is determined by the claims that follow.

What is claimed is:

1. A method of forming a tungsten-containing layer over a substrate, the method comprising:
    a) positioning a substrate on a substrate support in a process volume of a process chamber;
    b) providing a precursor gas to the process volume of the process chamber for a first duration; and
    c) providing a tungsten-containing gas to the process volume of the process chamber by opening a pulsing valve on a tungsten-containing gas delivery line for a second duration occurring after the first duration to form a tungsten-containing layer on the substrate, wherein
    the tungsten-containing gas delivery line includes a first section connected to an inlet of the pulsing valve and a second section connected to an outlet of the pulsing valve,
    the first section connects the inlet of the pulsing valve to a reservoir of tungsten-containing gas,
    the second section connects the outlet of the pulsing valve to an inlet of the process volume of the process chamber, and
    an internal cross-sectional area of the first section of the tungsten-containing gas delivery line is at least 10% larger than an internal cross-sectional area of the second section of the tungsten-containing gas delivery line.

2. The method of claim 1, further comprising providing a carrier gas to the second section of the tungsten-containing gas delivery line when the tungsten-containing gas is provided to the process volume of the process chamber.

3. The method of claim 2, wherein operations b) and c) are repeated five or more times to increase a thickness of the tungsten-containing layer formed on the substrate.

4. The method of claim 2, wherein the internal cross-sectional area of the first section of the tungsten-containing gas delivery line is at least 30% larger than the internal cross-sectional area of the second section of the tungsten-containing gas delivery line.

5. The method of claim 2, wherein the internal cross-sectional area of the first section of the tungsten-containing gas delivery line is at least 50% larger than the internal cross-sectional area of the second section of the tungsten-containing gas delivery line.

6. The method of claim 2, wherein the first section has an internal diameter of $3/8$ of an inch, and the second section has an internal diameter of $1/4$ of an inch.

7. The method of claim 4, wherein the carrier gas is argon.

8. The method of claim 1, wherein the tungsten-containing gas is tungsten hexafluoride.

9. The method of claim 1, wherein the tungsten-containing gas is provided to the process volume of the process chamber by opening the pulsing valve for a duration from about 0.5 seconds to about 10.0 seconds.

10. A method of forming a tungsten-containing layer, the method comprising:
    a) positioning a substrate on a substrate support in a process volume of a process chamber;
    b) providing a precursor gas to the process volume of the process chamber for a first duration; and
    c) providing a tungsten-containing gas to the process volume of the process chamber by opening a pulsing valve on a tungsten-containing gas delivery line for a second duration occurring after the first duration to form a tungsten-containing layer on the substrate, wherein
    the tungsten-containing gas delivery line includes a first section connected to an inlet of the pulsing valve and a second section connected to an outlet of the pulsing valve,
    the first section connects the inlet of the pulsing valve to a reservoir of tungsten-containing gas, and
    the second section connects the outlet of the pulsing valve to an inlet of the process volume of the process chamber; and
    providing a carrier gas to the second section of the tungsten-containing gas delivery line without providing the carrier gas to the first section of the tungsten-containing gas delivery line.

11. The method of claim 10, wherein the carrier gas is provided at a location on the second section of the tungsten-containing gas delivery line that is from about 0.5 inches to about 6.0 inches downstream from the outlet of the pulsing valve.

12. The method of claim 10, wherein the carrier gas is provided at location on the second section of the tungsten-containing gas delivery line that is from about 1.0 inch to about 3.0 inches downstream from the outlet of the pulsing valve.

13. The method of claim 10, wherein the tungsten-containing gas is tungsten hexafluoride.

14. The method of claim 13, wherein the tungsten-containing gas is provided to the process volume of the process chamber by opening the pulsing valve for a duration from about 0.5 seconds to about 10.0 seconds.

15. A method of forming a tungsten-containing layer over a substrate, the method comprising:
   a) positioning a substrate on a substrate support in a process volume of a process chamber;
   b) providing a boron-containing gas to the process volume of the process chamber for a first duration; and
   c) providing a tungsten-containing gas to the process volume of the process chamber by opening a pulsing valve on a tungsten-containing gas delivery line for a second duration occurring after the first duration to form a tungsten-containing layer on the substrate, the tungsten-containing layer filling a plurality of structures disposed over the substrate, wherein
   the tungsten-containing gas delivery line includes a first section connected to an inlet of the pulsing valve and a second section connected to an outlet of the pulsing valve,
   the first section connects the inlet of the pulsing valve to a reservoir of tungsten-containing gas,
   the second section connects the outlet of the pulsing valve to an inlet of the process volume of the process chamber, and
   an internal cross-sectional area of the first section of the tungsten-containing gas delivery line is at least 10% larger than an internal cross-sectional area of the second section of the tungsten-containing gas delivery line.

16. The method of claim 15, further comprising providing a carrier gas to the second section of the tungsten-containing gas delivery line when the tungsten-containing gas is provided to the process volume of the process chamber.

17. The method of claim 16, wherein operations b) and c) are repeated five or more times to increase a thickness of the tungsten-containing layer formed on the substrate.

18. The method of claim 16, wherein the carrier gas is provided at location on the second section of the tungsten-containing gas delivery line that is from about 1.0 inch to about 3.0 inches downstream from the outlet of the pulsing valve.

19. The method of claim 15, wherein the tungsten-containing gas is tungsten hexafluoride.

20. The method of claim 18, wherein the boron-containing gas is diborane.

* * * * *